(12) United States Patent
Huang et al.

(10) Patent No.: US 7,273,092 B2
(45) Date of Patent: Sep. 25, 2007

(54) MODULARIZED COOLER

(75) Inventors: Jung-Fong Huang, Sanchong (TW); Chih-Chien Huang, Sansia Township, Taipei County (TW)

(73) Assignee: Forward Electronics Co., Ltd., Taipei (TW)

( * ) Notice: Subject to any disclaimer, the term of this patent is extended or adjusted under 35 U.S.C. 154(b) by 301 days.

(21) Appl. No.: 11/088,742

(22) Filed: Mar. 25, 2005

(65) Prior Publication Data

US 2006/0108105 A1 May 25, 2006

(30) Foreign Application Priority Data

Nov. 23, 2004 (TW) .............................. 93218784 U

(51) Int. Cl.
*F28D 1/047* (2006.01)
(52) U.S. Cl. ...................... 165/149; 165/150; 165/151; 165/121
(58) Field of Classification Search ......... 165/149–151
See application file for complete search history.

(56) References Cited

U.S. PATENT DOCUMENTS

| | | | | |
|---|---|---|---|---|
| 1,788,068 A | * | 1/1931 | Scott | 165/149 |
| 1,929,937 A | * | 10/1933 | Slagel | 165/149 |
| 2,047,799 A | * | 7/1936 | Rodman | 62/231 |
| 2,118,206 A | * | 5/1938 | Kritzer et al. | 165/149 |
| 2,189,652 A | * | 2/1940 | Lehman | 165/149 |
| 2,354,131 A | * | 7/1944 | Larkin | 165/68 |
| 3,780,799 A | * | 12/1973 | Pastemak | 165/150 |
| 4,580,623 A | * | 4/1986 | Smitte et al. | 165/150 |
| 5,940,270 A | * | 8/1999 | Puckett | 361/699 |
| 6,263,957 B1 | * | 7/2001 | Chen et al. | 165/80.4 |
| 6,926,070 B2 | * | 8/2005 | Jenkins et al. | 165/79 |
| 2005/0099774 A1 | * | 5/2005 | Song | 361/700 |
| 2005/0243514 A1 | * | 11/2005 | Malone et al. | 361/697 |

\* cited by examiner

*Primary Examiner*—Allen J. Flanigan
(74) *Attorney, Agent, or Firm*—Bacon & Thomas, PLLC

(57) ABSTRACT

A modularized cooler includes the at least two heat radiator modules arranged in a stack, each heat radiator module having a set of radiation fins, heat-exchange tubes arranged in parallel and surrounded by the radiation fins, two locating plates holding the heat-exchange tubes in place, and a plurality of first bends and second bends respectively connected between every two adjacent heat-exchange tubes at two sides of the radiation fins and forming with the heat-exchange tubes a continuously S-shaped piping having an inlet and an outlet, and at least one connecting tubes that connect the S-shaped pipings of the heat radiator modules in series.

5 Claims, 6 Drawing Sheets

MODULARIZED COOLER

BACKGROUND OF THE INVENTION

1. Field of the Invention

The present invention relates to a cooler for cooling an electronic device and more particularly, to a modularized cooler.

2. Description of Related Art

FIG. 1 is a rear side view of a fluid cooling type cooler for computer according to the prior art. According to this design, the heat-exchange tubes 10 of the cooler are arranged in a staggered manner that imparts a barrier to the flowing of currents of air caused by the fan 11, thereby resulting in a high wind resistance between the fan 11 and the heat radiator 1. The staggered arrangement of the heat-exchange tubes 10 results in a bulky size of the heat radiator 1.

Referring to FIG. 2, the heat-exchange tubes 10 of the heat radiator 1 are fixedly mounted inside the radiation fins 12 and arranged into two rows that are spaced from the fan 11 at different distances, thereby defining a hot flow zone 13 and a sub-hot flow zone 14 that cause direct heat conduction at the radiation fins 12 to lower heat dissipation efficiency. Further, because the heat-exchange tubes 10 are fixedly mounted inside the radiation fins 12, the heat dissipation efficiency of the heat radiator 1 is fixed, and the user cannot change or expand the design.

SUMMARY OF THE INVENTION

The present invention has been accomplished under the circumstances in view. According to one aspect of the present invention, the modularized cooler comprises the at least two heat radiator modules arranged together. Each heat radiator module comprises a plurality of radiation fins, a plurality of heat-exchange tubes, two locating plates, a plurality of first bends, and a plurality of second bends. The radiation fins are arranged in parallel and spaced from one another in longitudinal direction at a predetermined pitch through which said cooling airflow passing. Each radiation fin has a plurality of through holes extending in longitudinal direction. The heat-exchange tubes are respectively longitudinally mounted inside the through holes of the radiation fins and arranged in parallel. The two locating plates are respectively fastened to the radiation fins at two longitudinally opposite sides. Each locating plate has a plurality of through holes extending in longitudinal direction and respectively coupled to the ends of the heat-exchange tubes. The first bends are connected between every two adjacent heat-exchange tubes at one side of the radiation fins. The second bends are connected between every two adjacent heat-exchange tubes at the longitudinal opposite side of the radiation fins. The first bends and the second bends are arranged in a staggered manner at the two opposite sides of the radiation fins and connected in series to the heat-exchange tubes to form a continuously S-shaped piping, which has an inlet and an outlet.

The modularized cooler further comprises at least one connecting tube connected between the outlet of the continuously S-shaped piping of one of the at least two heat radiator modules and the inlet of the continuously S-shaped piping of another of the at least two heat radiator modules.

By means of the arrangement of the at least two heat radiator modules and the connection of the at least one connecting tube between the at least two heat radiator modules, the invention eliminates the formation of wind resistance as seen in the prior art design due to staggered arrangement of heat-exchange tubes, and greatly reduces the dimensions of the cooler. Further, the manufacturer can increase the number of the heat radiator modules subject to different demands. The use of the modularized heat radiator modules and their arrangement in parallel eliminate the problem of the prior art design due to direct heat conduction, thereby improving the heat dissipation efficiency of the cooler.

The modularized cooler further comprises at least one fan, for providing a cooling airflow.

Further, the at least two heat radiator modules may be arranged in a stack. The locating plates of the at least two heat radiator modules each have a mounting lug, for fastening together. Further, the mounting lugs of the locating plates of the at least two heat radiator modules each have a mounting hole, threaded with a screw for fastening together. The at least one heat insulation pad may be mounted in between the mounting lugs of the locating plates of the at least two heat radiator modules.

DETAILED DESCRIPTION OF THE PREFERRED EMBODIMENT

Figure 1:
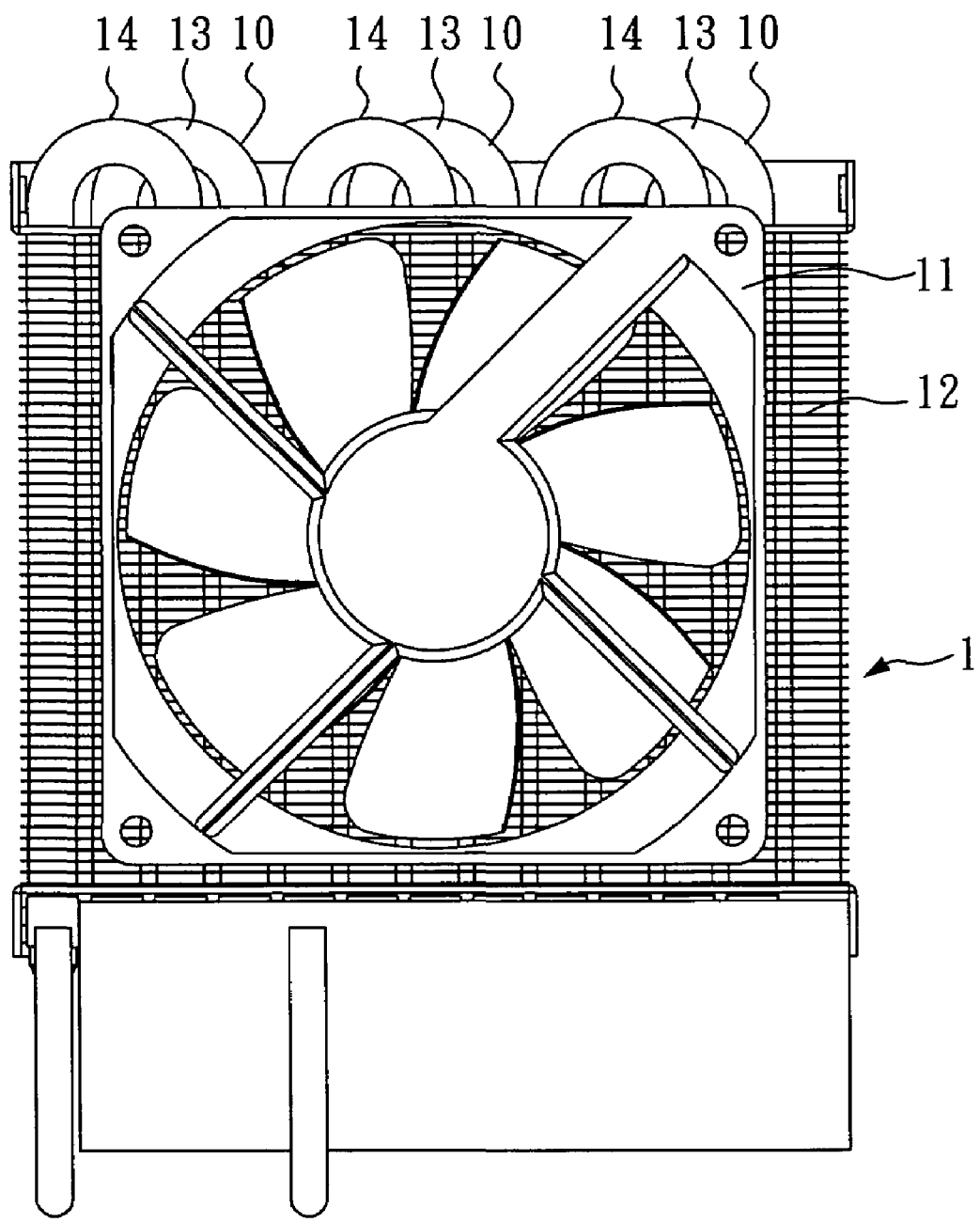
FIG. 1 is a rear side view of a cooler according to the prior art.
Figure 2:
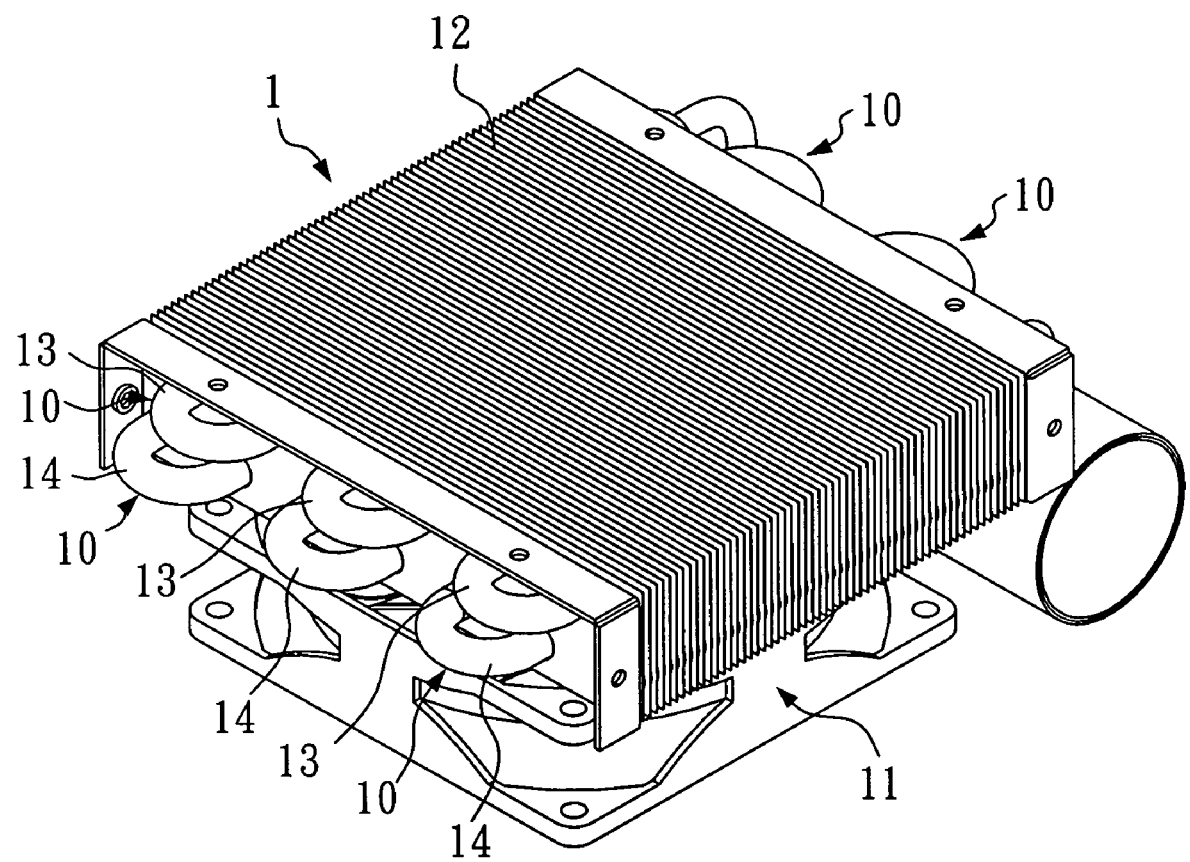
FIG. 2 is a perspective view of the cooler according to the prior art.
Figure 3:
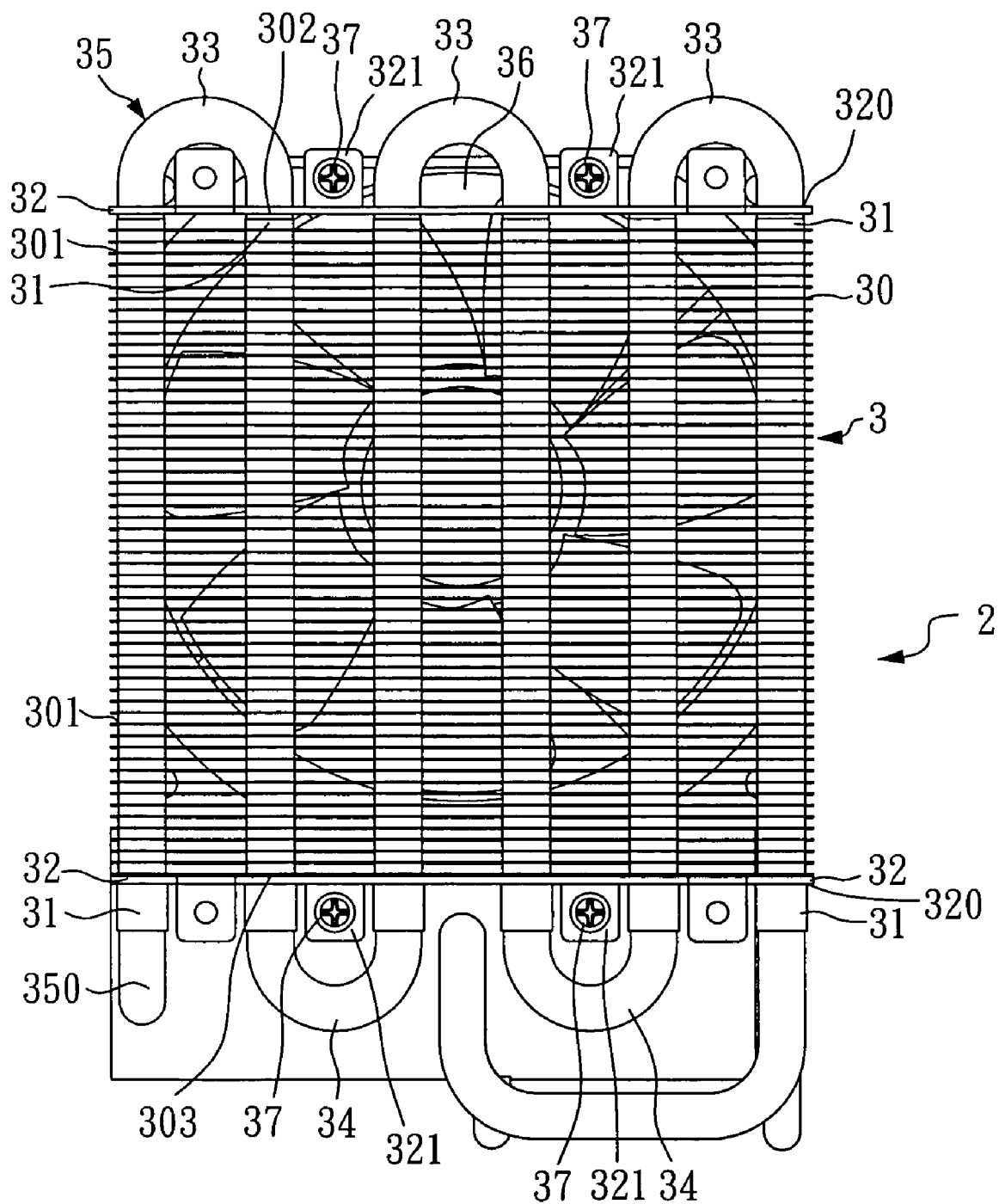
FIG. 3 is a front view of a modularized cooler according to the present invention.
Figure 4:
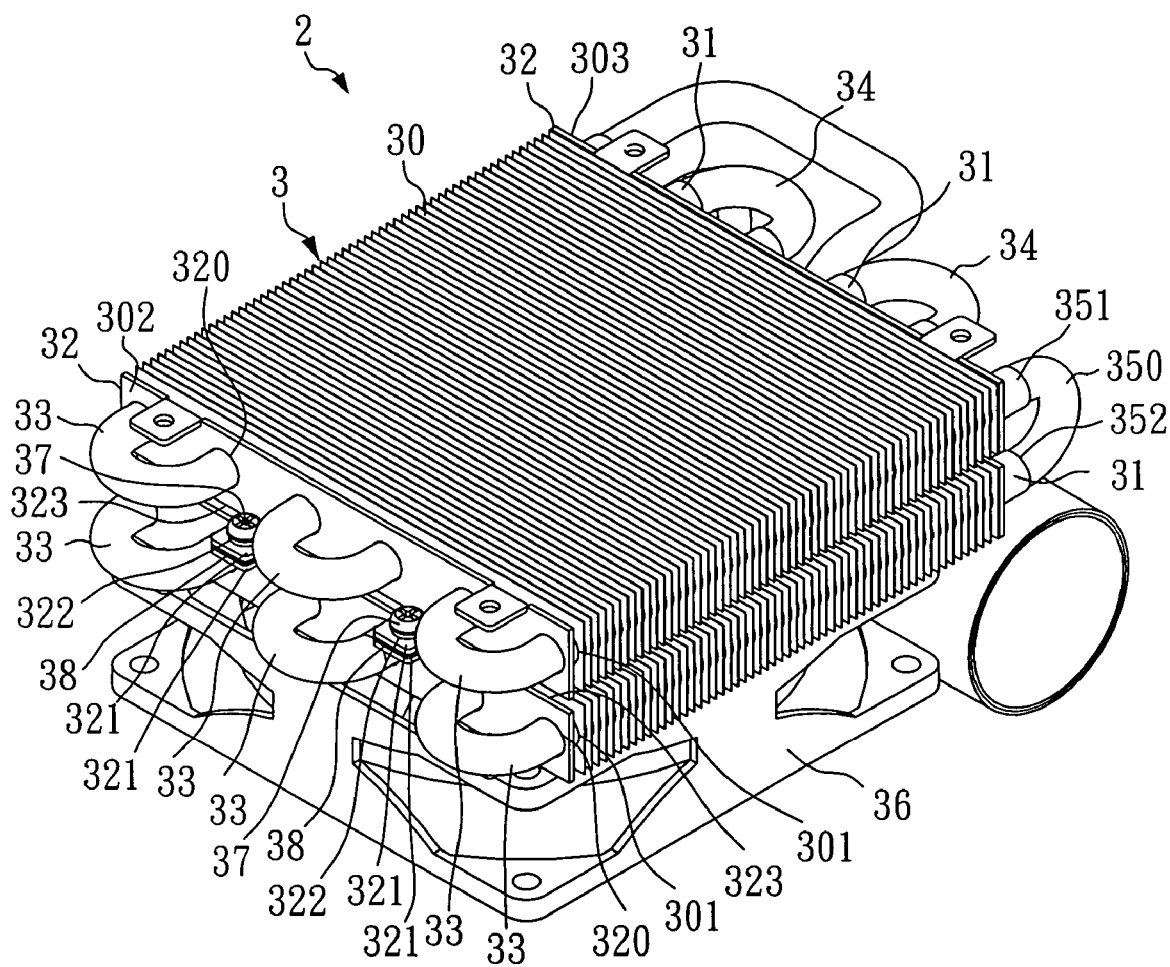
FIG. 4 is an elevational view of the modularized cooler according to the present invention.
Figure 5:
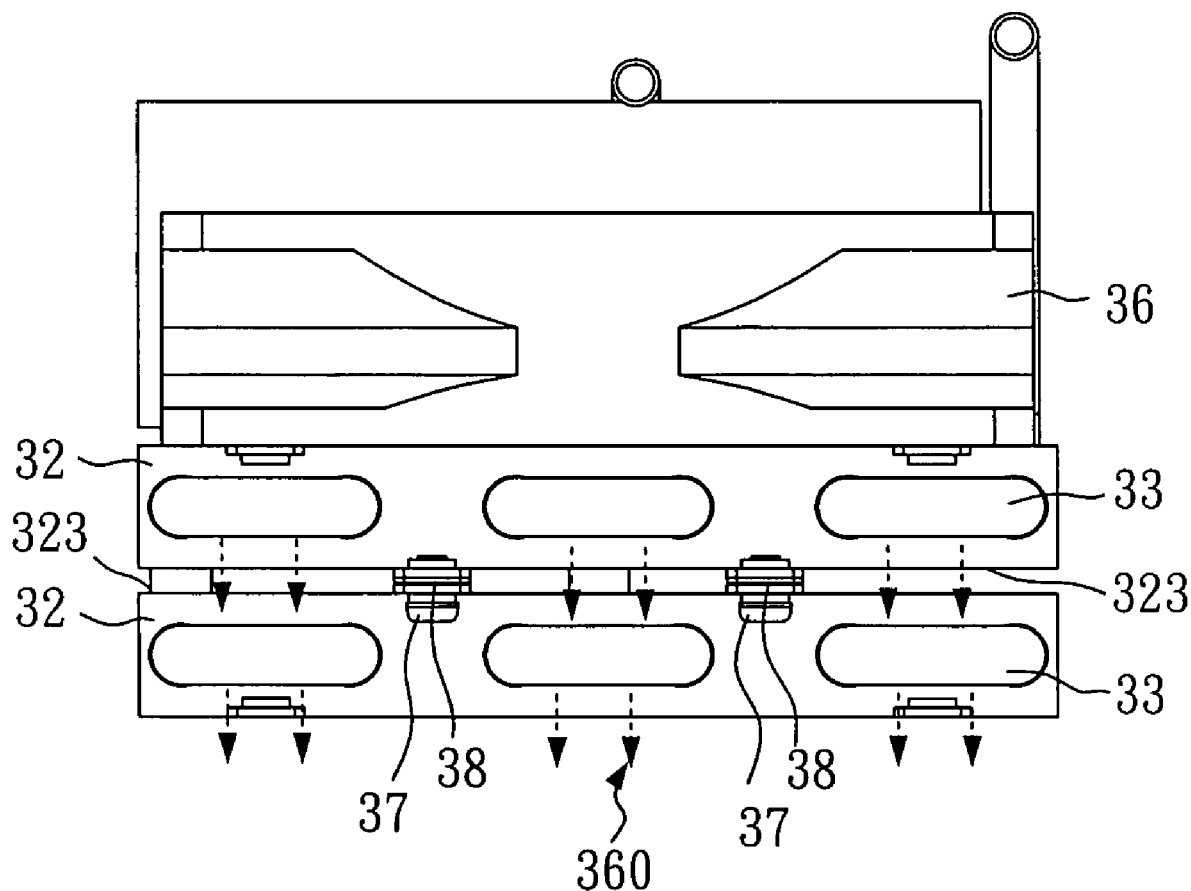
FIG. 5 is a top view of the modularized cooler according to the present invention.

Referring to FIGS. 3~5, a modularized cooler 2 in accordance with the present invention is shown comprised of two heat radiator modules 3, a connecting tube 350, and a fan 36.

The two heat radiator modules 3 are arranged in a stack, each comprising a plurality of radiation fins 30, and a plurality of heat-exchange tubes 31, two locating plates 32, a plurality of first bends 33, and a plurality of second bends 34. According to this embodiment, the radiation fins 30 are arranged in parallel and spaced from one another in longitudinal direction at a predetermined pitch, each having a plurality of through holes 301 extending in longitudinal direction. The heat-exchange tubes 31 are straight tubes respectively longitudinally mounted inside the through holes 301 of the radiation fins 30 and arranged in parallel.

Further, the two locating plates 32 are respectively fastened to the first outer side 302 and second outer side 303 of the set of radiation fins 30 of the respective heat radiator module 3 and arranged in parallel, each having a plurality of through holes 320 extending in longitudinal direction and respectively coupled to the ends of the heat-exchange tubes 32. As shown in the drawings, the first bends 33 are connected between every two adjacent heat-exchange tubes 31 at the first outer side 302 of the set of radiation fins 30, and the second bends 34 are respectively connected between every two adjacent heat-exchange tubes 31 at the second outer side 303 of the set of radiation fins 30. The first bends 33 and the second bends 34 are arranged in a staggered manner at the first outer side 302 and second outer side 303 of the set of radiation fins 30 and connected in series with the heat-exchange tubes 31 to form a continuously S-shaped piping 35, which has an inlet 351 and an outlet 352.

Further, the connecting tube 350 is connected between the outlet 352 of the continuously S-shaped piping 35 of one of the two heat radiator modules 3 and the inlet 351 of the continuously S-shaped piping 35 of the other of the two heat radiator modules 3, i.e., the connecting tube 350 connects the continuously S-shaped piping 35 of the two heat radiator modules 3 in series.

Further, the fan 36 is fastened to one side of the stack of the two heat radiator modules 3, providing a flow field 360 in parallel to the radiation fins 30 for passing through the pitch between each two adjacent radiation fins 30.

Further, the locating plates 32 of the two heat radiator modules 3 each have a plurality of mounting lugs 321. Each mounting lug 321 has a mounting hole 322. The mounting holes 322 of the mounting lugs 321 of each locating plate 32 of one heat radiator module 3 are respectively fastened to the mounting holes 322 of the mounting lugs 321 of the corresponding locating plate 32 of the other heat radiator module 3 by screws 37. Each screw 37 may be mounted with a nut (not shown).

This embodiment further comprises a plurality of heat insulation pads 38 respectively connected between the mounting lugs 321 of the heat radiator modules 3 to effectively separate heat energy of the heat flow zone and sub-heat flow zone between the two heat radiator modules 3.

By means of the aforesaid structure, the invention eliminates the formation of wind resistance as seen in the prior art design due to staggered arrangement of heat-exchange tubes, and greatly reduces the dimensions of the modularized cooler 2. Further, the heat radiator modules 3 are modularized members. The manufacturer can increase the number of the heat radiator modules 3 subject to different demands. The use of the modularized heat radiator modules 3 and their arrangement in series eliminate the problem of the prior art design due to direct heat conduction, thereby improving the heat dissipation efficiency of the modularized cooler 2.

Figure 6:
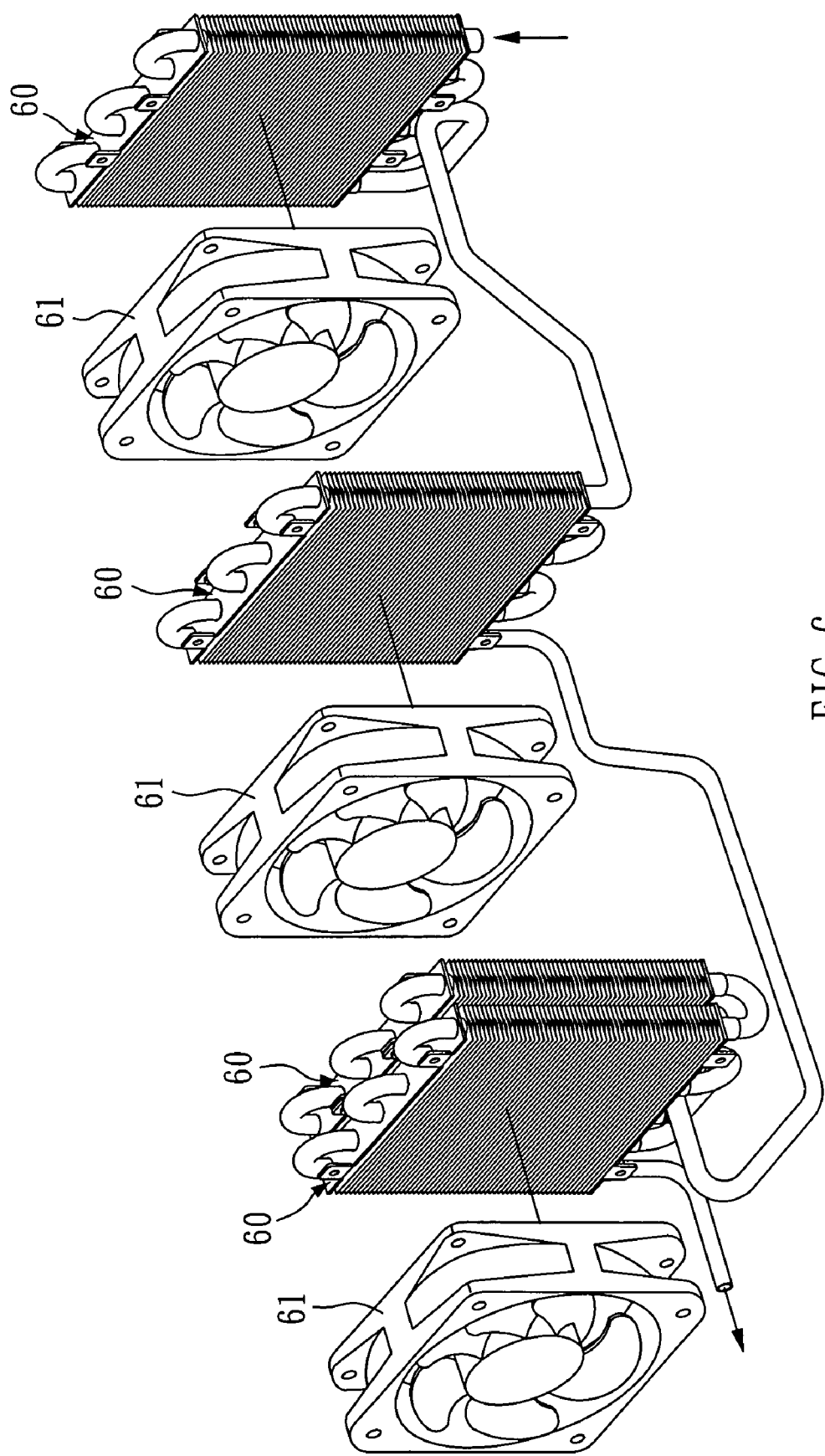
FIG. 6 is an exploded view of an alternate form of the modularized cooler according to the present invention.

FIG. 6 is an exploded view of an alternate form of the modularized cooler according to the present invention. This embodiment uses four heat radiator modules 60 and three fans 61. The heat radiator modules 60 can be directly arranged in a stack. Alternatively, the heat radiator modules 60 can be arranged in parallel and spaced from one another at a pitch. Setting the fans 61 in between each two heat radiator modules 60 accelerating the heat dissipation efficiency of the heat radiator modules 60.

Although the present invention has been explained in relation to its preferred embodiment, it is to be understood that many other possible modifications and variations can be made without departing from the spirit and scope of the invention as hereinafter claimed.

What is claimed is:

1. A modularized cooler comprising:

at least two heat radiator modules arranged in parallel and in a stack and perpendicular to a cooling airflow, each said heat radiator module comprising a plurality of radiation fins, a plurality of heat-exchange tubes, two locating plates, at least one heat insulation pad, a plurality of first bends, and a plurality of second bends, said plurality of radiation fins being arranged in parallel and spaced from one another in a longitudinal direction at a predetermined pitch through which said cooling airflow passes, each said radiation fin having a plurality of through holes extending in a longitudinal direction, said heat-exchange tubes being respectively mounted inside the through holes of said radiation fins and arranged in parallel, said two locating plates being respectively fastened to said plurality of radiation fins at two longitudinally opposite sides, each said locating plate having a plurality of through holes extending in the longitudinal direction and respectively coupled to the periphery of two ends of each of said heat-exchange tubes, each said locating plate having a mounting lug for fastening together, said at least one heat insulation pad mounted in between the mounting lugs of the locating plates, each said first bend being connected between every two adjacent heat-exchange tubes at one longitudinal side of said radiation fins, each said second bend being connected between every two adjacent heat-exchange tubes at the opposite longitudinal side of said plurality of radiation fins, said plurality of first bends and said plurality of second bends being arranged in a staggered manner at the two opposite sides of said plurality of radiation fins and connected in series to said plurality of heat-exchange tubes to form a continuously S-shaped piping having an inlet and an outlet; and at least one connecting tube correspondingly connected between the outlet of the continuously S-shaped piping of one of said at least two heat radiator modules and the inlet of the continuously S-shaped piping of another of said at least two heat radiator modules.

2. The modularized cooler as claimed in claim 1, further comprising at least one fan for providing said cooling airflow.

3. The modularized cooler as claimed in claim 2, wherein said at least one fan is arranged at one side of said at least two heat radiator modules.

4. The modularized cooler as claimed in claim 1, wherein the mounting lugs of said locating plates of said at least two heat radiator modules each have a mounting hole threaded with a screw for fastening together.

5. A modularized cooler comprising:

at least two heat radiator modules arranged in parallel and perpendicular to a cooling airflow, each said heat radiator module comprising a plurality of radiation fins, a plurality of heat-exchange tubes, two locating plates, a plurality of first bends, and a plurality of second bends, said plurality of radiation fins being arranged in parallel and spaced from one another in longitudinal direction at a predetermined pitch through which said cooling airflow passes, each said radiation fin having a plurality of through holes extending in a longitudinal direction, said heat-exchange tubes being respectively mounted inside the through holes of said radiation fins and arranged in parallel, said two locating plates being respectively fastened to said plurality of radiation fins at two longitudinally opposite sides, each said locating plate having a plurality of through holes extending in the longitudinal direction and respectively coupled to the periphery of two ends of each of said heat-exchange tubes, each said first bend being connected between every two adjacent heat-exchange tubes at one longitudinal side of said plurality of radiation fins, each said second bend being connected between every two adjacent heat-exchange tubes at the opposite longitudinal side of said plurality of radiation fins, said plurality of first bends and said plurality of second bends being arranged in a staggered manner at the two opposite sides of said plurality of radiation fins and connected in series to said plurality of heat-exchange tubes to form a continuously S-shaped piping having an inlet and an outlet;

at least one fan arranged in between said at least two heat radiator modules for providing said cooling airflow; and at least one connecting tube correspondingly connected between the outlet of the continuously S-shaped piping of one of said at least two heat radiator modules and the inlet of the continuously S-shaped piping of another of said at least two heat radiator modules.

* * * * *